United States Patent
Satoh

Patent Number: 5,296,734
Date of Patent: Mar. 22, 1994

[54] SEMICONDUCTOR INTEGRATED CIRCUIT HAVING SILICON NITRIDE PROVIDED AS INSULATOR OF CAPACITOR

[75] Inventor: Megumi Satoh, Tokyo, Japan
[73] Assignee: NEC Corporation, Tokyo, Japan
[21] Appl. No.: 902,110
[22] Filed: Jun. 22, 1992
[30] Foreign Application Priority Data
Jun. 21, 1991 [JP] Japan ................................. 3-149084
[51] Int. Cl.$^5$ ........................................... H01L 29/34
[52] U.S. Cl. ...................................... 257/638; 257/532; 257/637; 257/641; 257/649
[58] Field of Search ........ 257/320, 296, 379, 532–535, 257/637, 638, 640, 641, 649

[56] References Cited
U.S. PATENT DOCUMENTS

4,612,563  9/1986  Macdougall et al. ................ 257/310

Primary Examiner—J. Carroll

[57] ABSTRACT

An integrated circuit comprises a semiconductor substrate, a plurality of islands formed at a principal surface of the substrate and isolated from one another by a PN junction, an interlayer insulating film formed to substantially cover the principal surface of the substrate, and a capacitor formed in a selected one of the islands and having a dielectric layer which is formed within an opening formed in the interlayer insulating film above the selected island. The dielectric layer is constituted of a multilayer film including a silicon oxide film and a silicon nitride film extending to cover the interlayer insulating film. A power supply line conductor is formed on the interlayer insulating film, and the silicon nitride film is completely removed from a portion of the interlayer insulating film directly under the power supply line conductor.

3 Claims, 2 Drawing Sheets

SEMICONDUCTOR INTEGRATED CIRCUIT HAVING SILICON NITRIDE PROVIDED AS INSULATOR OF CAPACITOR

BACKGROUND OF THE INVENTION

1. Field of the Invention

The present invention relates to a semiconductor integrated circuit, and more specifically, to a silicon nitride film used in a capacitor formed in a semiconductor integrated circuit.

2. Description of Related Art

In a conventional semiconductor integrated circuit in accordance with a high voltage bipolar process, an epitaxial layer grown on a whole surface of a substrate is divided into a plurality of islands isolated from one another by PN junctions. In each of the islands thus formed, a circuit element such as a transistor, a capacitor or a resistor is formed.

For example, a capacitor is formed in some of the islands. The capacitor includes a lower electrode constituted of an diffusion layer formed in the epitaxial layer within the island, and a dielectric layer composed of a thin silicon oxide film and a thin silicon nitride film, which are formed after selectively removing in a first contact formation process an interlayer insulating film formed to cover the whole surface of the epitaxial layer. After formation of the thin silicon oxide film and the thin silicon nitride film, a metal layer such as an aluminum layer is sputtered so as to form not only an upper electrode of the capacitor but also a power supply line conductor in other regions.

Here, the silicon nitride used as the dielectric layer reforms or rectifies a curvature of the semiconductor substrate caused by a difference in thermal expansion coefficient between the semiconductor substrate and a silicon oxide film which constitutes the interlayer insulating film. H. Mikoshiba et al reported that a $h_{FE}$ parameter—current characteristics of transistors can be improved in a wide range by correcting the curvature of the semiconductor substrate (See Journal of Electrochemical Society, Vol. 123, No. 10, October 1976, pp. 1539~1545).

However, the silicon nitride film is formed not only in a region of the capacitor, but also on the whole of the semiconductor integrated circuit, and the silicon nitride film is selectively etched in only positions where the diffusion layer and a metal conductor are connected to each other.

In the conventional semiconductor integrated circuit, if a portion of the interlayer film other than predetermined opening formation positions is removed in the first contact formation process by any unexpected cause, a structure of a thin nitride film and a thin oxide film (called a "pin hole structure" hereinafter) is formed.

If the pin hole structure exists under the power supply line conductor, since the silicon nitride has a some degree of withstand voltage, integrated circuits having the pin hole structure will pass a product inspection conducted in the process of manufacturing the semiconductor integrated circuits, and therefore, delivered into a market.

However, even if the integrated circuit having the pin hole structure operates as a non-defective product, carriers are accumulated by injection of a current into the nitride film/oxide film from the power supply line conductor, so that a local electric field gradually becomes intense. If the gradually intensified local electric field exceeds a certain limit, the film is broken down.

In the case of a high voltage bipolar transistor, a voltage of about 50 V is applied between the power supply line and the semiconductor substrate. Therefore, failure of the semiconductor integrated circuit caused by the above mentioned breakdown will cause destruction of a package or failure of an external device. Thus, a shipping of the integrated circuits having the pin hole structure under the power supply line conductor has become a significant problem.

SUMMARY OF THE INVENTION

Accordingly, it is an object of the present invention to provide an integrated circuit which has overcome the above mentioned defect of the conventional integrated circuit.

Another object of the present invention is to provide an integrated circuit improved to make it possible to find the pin hole structure under the power supply line conductor as a defective in a manufacturing process before the shipping, so that the integrated circuits having the pin hole structure under the power supply line conductor are in no way delivered into a market.

The above and other objects of the present invention are achieved in accordance with the present invention by an integrated circuit comprising a semiconductor substrate, a plurality of islands formed at a principal surface of the substrate and isolated from one another, a capacitor formed in a selected one of the islands and having a dielectric layer constituted of an insulating layer including a silicon nitride film extending to cover the principal surface of the substrate, and a power supply line conductor formed on the principal surface of the substrate without intermediary of the silicon nitride film.

The above and other objects, features and advantages of the present invention will be apparent from the following description of preferred embodiments of the invention with reference to the accompanying drawings.

DESCRIPTION OF THE PREFERRED EMBODIMENTS

Figure 1:
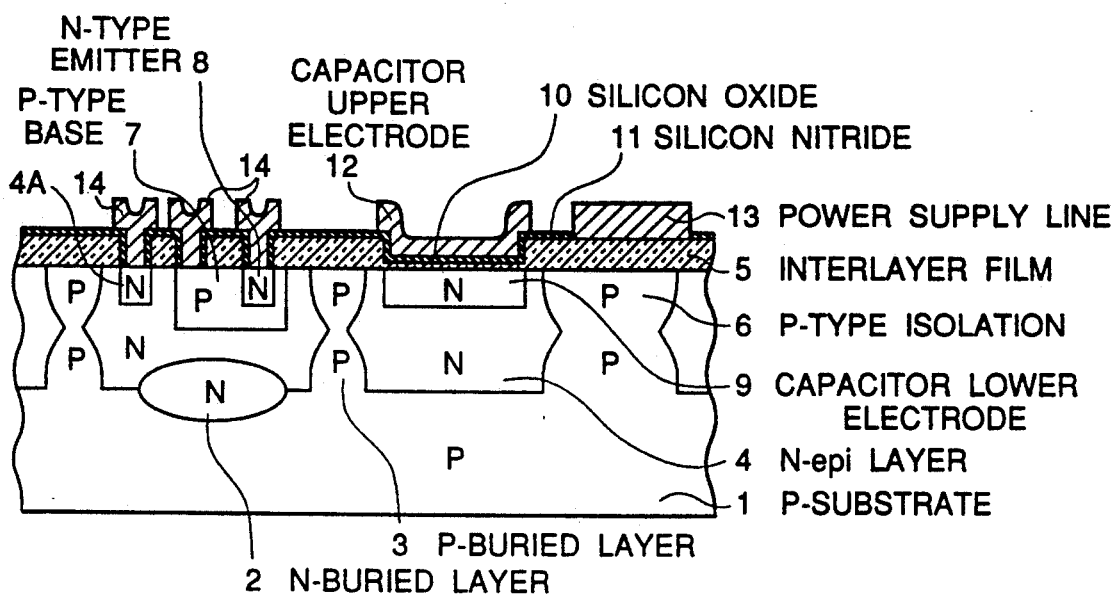
FIG. 1 is a diagrammatic sectional view of a first embodiment of the integrated circuit in accordance with the present invention.

Referring to FIG. 1, there is shown a diagrammatic sectional view of a first embodiment of the integrated circuit in accordance with the present invention.

The shown semiconductor integrated circuit is manufactured in accordance with a high voltage bipolar process, and includes a P type substrate 1. In accordance with the high voltage bipolar process, firstly, an N type buried layer 2 and a P type buried layer 3 are formed in the P type substrate 1, and an N type epitaxial layer 4 is grown on the whole surface of the substrate 1. An interlayer insulating film 5 formed of for example a silicon oxide film is formed on a surface of the N type epitaxial layer 4, and P type impurities are diffused through openings formed in the interlayer insulating film 5 so as to form a plurality of P type isolation regions 6. With the P type buried layer 3 and the P type isolation regions 6, the N type epitaxial layer 4 is divided into a plurality of islands isolated from one another by PN junctions. In each of the islands thus formed, a circuit element such as a transistor, a capacitor or a resistor is formed.

For example, an NPN transistor is formed in one island. The NPN transistor includes a collector constituted of the N type epitaxial layer 4 within the island, a base constituted of a P type diffusion layer 7 formed in the N type epitaxial layer 4, and an emitter 8 and a collector contact region 4A constituted of N type diffusion regions formed in the base region 7 and the N type epitaxial layer 4, respectively.

Figure 2:
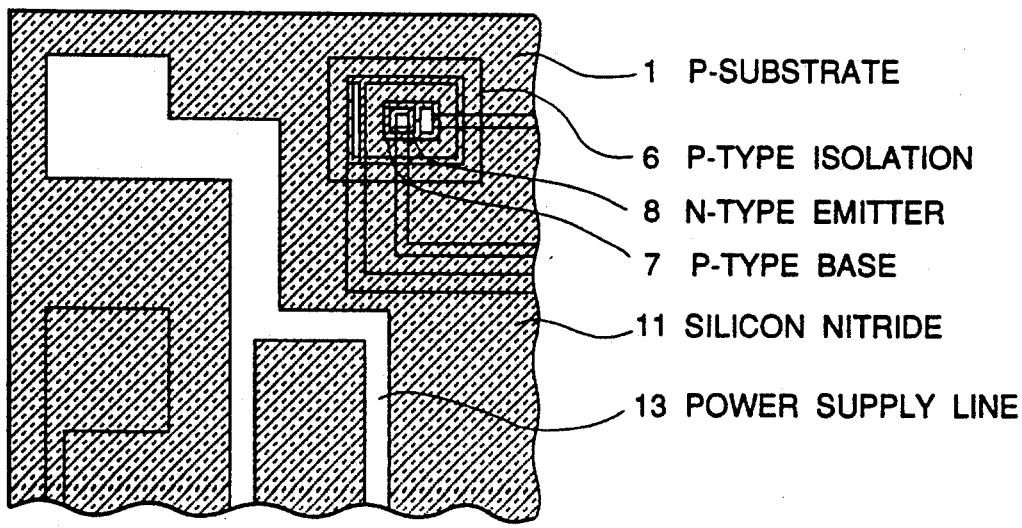
FIG. 2 is a layout pattern diagram of the first embodiment shown in FIG. 1.

In addition, a capacitor is formed in another island. The capacitor includes a lower electrode constituted of an N type diffusion layer 9 formed at the time of forming the emitter 8, and a dielectric layer composed of a thin silicon oxide film 10 and a thin silicon nitride film 11, which are formed after selectively removing the interlayer insulating film 5 in a first contact formation process. After formation of the thin silicon oxide film 10 and thin silicon nitride film 11, the thin silicon nitride 11 is selectively etch-removed as shown in FIG. 2 from positions where a power supply line conductor is located and contacts are formed in a second contact formation process. In the contact regions, the underlying silicon oxide film 10 is also removed. Thereafter, a metal layer such as an aluminum layer is sputtered so as to form an upper electrode 12 of the capacitor, a power supply line conductor 13 and contact electrodes 14 of the transistor, as shown in FIG. 1.

In the above mentioned manufacturing process, if in the first contact formation process for selectively etching the interlayer insulating film 5, no hole occurs in the interlayer insulating film 5 other than a capacitor formation region and contact formation regions of the transistor, the interlayer insulating film 5 directly under the power supply line conductor 13 has a substantial thickness, and therefore, has a sufficient withstand voltage.

Figure 3:
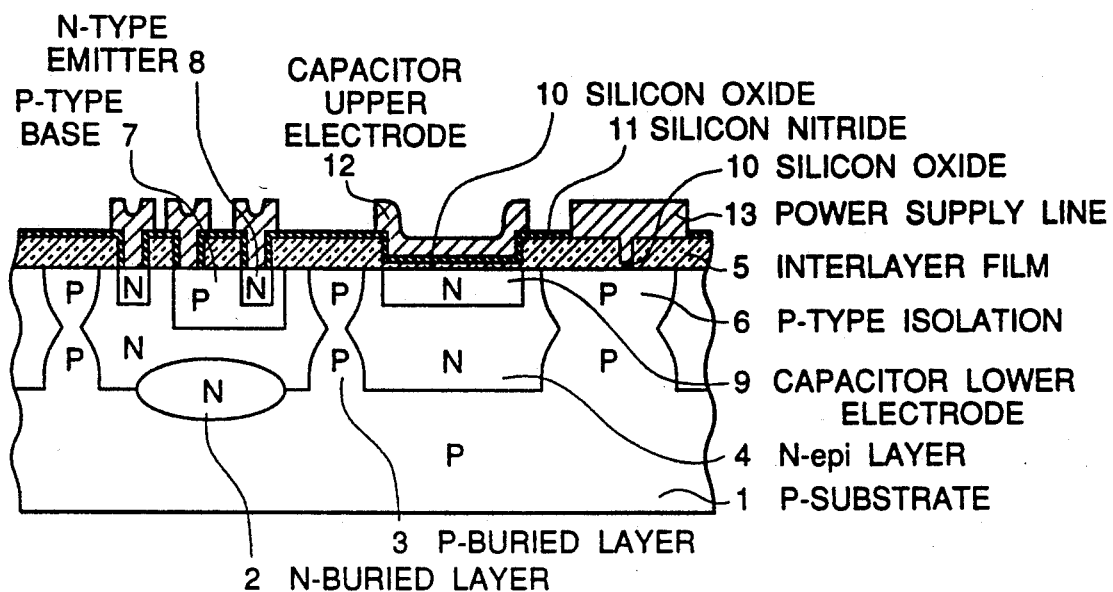
FIG. 3 is a view similar to FIG. 1, but showing an example of the integrated circuit having a defective in an interlayer insulating film under a power supply line conductor.

However, as shown in FIG. 3, if a pin hole has occurred in an power supply line conductor formation location of the interlayer insulating film 5 in the first contact formation process for selectively etching the interlayer insulating film 5, namely, if a defective exists in a portion of the interlayer insulating film 5 directly under the power supply line conductor 13, since the silicon nitride film 11 has been removed from the region under the power supply line conductor 13, an insulating film existing between the power supply line conductor 13 and the substrate 1 is composed of only the thin silicon oxide film 10 on the order of 100 Å. Since this thin silicon oxide film has only a withstand voltage not greater than 10 V, if a power supply voltage is applied in the product inspection of the semiconductor integrated circuit, the insulating film under the power supply line conductor 13 will be broken down. Therefore, this defective semiconductor integrated circuit chip can be found as a defective product with probability of 100% in a wafer inspection process.

Therefore, products having a defect in the interlayer insulating layer directly under the power supply line conductor 13 can be prevented from being delivered to a market.

As seen from FIG. 2, the silicon nitride film 11 remains on the silicon oxide film 5 in a large area excluding the limited area directly under the power supply line conductor 13 and the contact electrodes 14. The remaining silicon nitride film 11 corrects the curvature of the semiconductor substrate 1 which is caused by etching the oxide film 5 at a normal temperature after the oxide film 5 has been deposited at a high temperature. Therefore, the current dependency of the parameter $h_{FE}$ in NPN transistors and PNP transistors can be unified in a wide range.

Figure 4:
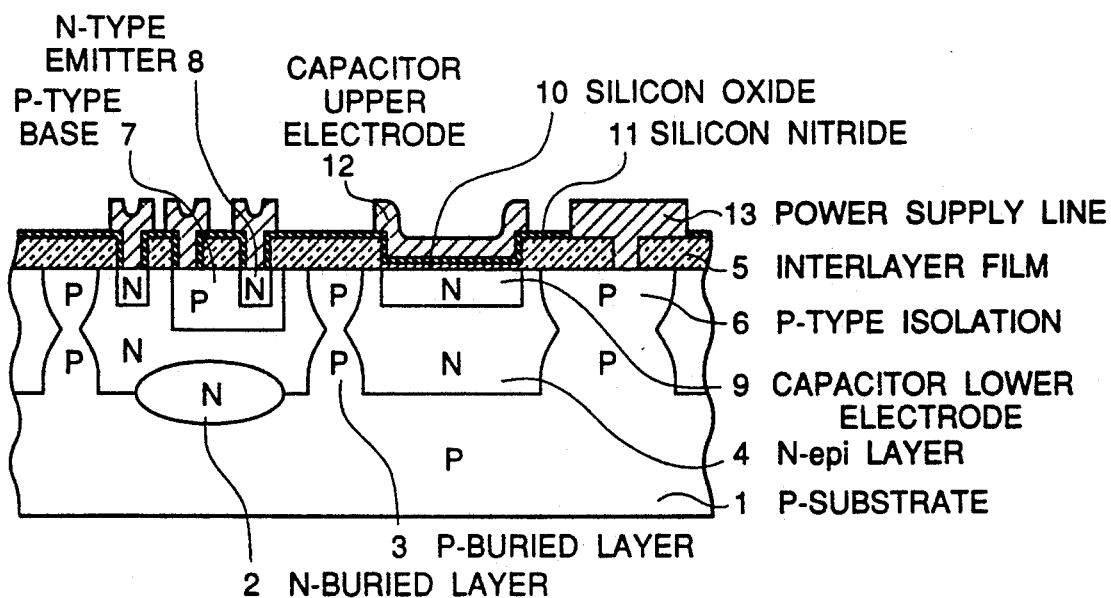
FIG. 4 is a diagrammatic sectional view of a second embodiment of the integrated circuit in accordance with the present invention.

Referring to FIG. 4, there is shown a diagrammatic sectional view of a second embodiment of the integrated circuit in accordance with the present invention.

In the second embodiment, the silicon oxide film 10 directly under the silicon nitride film 11 is selectively removed from the region excluding the capacitor formation region, so that if a pin hole exists in the interlayer insulating film 5 under directly the power supply line conductor 13, the power supply line conductor 13 will be directly contacted with the substrate 1 with no insulating layer between the power supply line conductor 13 and the substrate 1.

In the first embodiment, when a pin hole exists in the interlayer insulating film 5 under directly under the power supply line conductor 13, the thin silicon oxide film 10 remains between the power supply line conductor 13 and the substrate 1. Therefore, in order to find out a semiconductor integrated circuit chip having the pin hole in the interlayer insulating layer 5 in the wafer inspection process, it is necessary to apply a voltage for a period of time sufficient to break down the thin silicon oxide film 10. However, in the second embodiment, if a defect of a pin hole occurs in the interlayer insulating layer under the power supply line conductor formation region, power supply terminals of opposite polarities are short-circuited immediately at the beginning of the wafer inspection process. Therefore, a defective product detection time can be shortened in the inspection process, and a defective product detection becomes easy.

The invention has thus been shown and described with reference to the specific embodiments. However, it should be noted that the present invention is in no way limited to the details of the illustrated structures but changes and modifications may be made within the scope of the appended claims.

I claim:

1. An integrated circuit comprising a semiconductor substrate, a plurality of islands formed at a principal surface of the substrate and isolated from one another, an interlayer insulating film formed to substantially cover said principal surface of said substrate, a capacitor formed in a selected one of said islands and having a dielectric layer which is formed within an opening formed in said interlayer insulating film above said selected island, said dielectric layer including a silicon nitride film, and a power supply line conductor formed on said interlayer insulating film without intermediary of said silicon nitride film, said silicon nitride film extending to cover all the surface of said interlayer insulating film excluding an area under said power supply line conductor.

2. An integrated circuit comprising a semiconductor substrate, a plurality of islands formed at a principal surface of the substrate and isolated from one another, an interlayer insulating film formed to substantially cover said principal surface of said substrate, a capacitor formed in a selected one of said islands and having a dielectric layer which is formed within an opening formed in said interlayer insulating film above said selected island, said dielectric layer including a silicon nitride film extending to cover said interlayer insulating film, and a power supply line conductor formed on said interlayer insulating film without intermediary of said silicon nitride film, wherein said dielectric layer is formed of a multilayer film including a silicon oxide film and said silicon nitride film, both of which substantially extend to cover said interlayer insulating film, and said power supply line conductor is formed on said interlayer insulating film with intermediary of only said silicon oxide film.

3. An integrated circuit claimed in claim 1, wherein said dielectric layer is formed of a multilayer film including a silicon oxide film and said silicon nitride film, both of which extend to cover said interlayer insulating film, and said power supply line conductor is formed on said interlayer insulating film also without intermediary of said silicon oxide film.

* * * * *